United States Patent

Börnert et al.

[11] Patent Number: 6,087,831
[45] Date of Patent: Jul. 11, 2000

[54] MR METHOD AND MR DEVICE FOR DETERMINING THE POSITION OF MICROCOIL

[75] Inventors: Peter Börnert; Markus Weiger; Bernd Aldefeld, all of Hamburg, Germany

[73] Assignee: U.S. Philips Corporation, New York, N.Y.

[21] Appl. No.: 09/024,630

[22] Filed: Feb. 17, 1998

[30] Foreign Application Priority Data

Feb. 20, 1997 [DE] Germany ............................ 197 06 703

[51] Int. Cl.[7] .................................................. G01V 3/00
[52] U.S. Cl. ............................................ 324/307; 600/424
[58] Field of Search .................................. 324/318, 322, 324/306, 312, 307, 309; 600/422, 423, 424

[56] References Cited

U.S. PATENT DOCUMENTS

| | | | |
|---|---|---|---|
| 5,353,795 | 10/1994 | Souza et al. | 128/653.2 |
| 5,644,234 | 7/1997 | Rasche et al. | 324/318 |
| 5,936,406 | 8/1999 | Potthast | 324/318 |

OTHER PUBLICATIONS

"Real Time Positioning Monitoring of Invasive Devices Using Magnetic Resonance" C.L. Domoulin et al, Magnetic Resonance in Medicine, Mar. 1993, pp. 411–415.

*Primary Examiner*—Louis Arana
*Attorney, Agent, or Firm*—Dwight H. Renfrew, Jr.

[57] ABSTRACT

The invention relates to an MR method and an MR device for determining the position of at least one microcoil (11, 12) which is provided in or on an object (1) to be examined which is situated in an examination zone. During the acquisition of microcoil MR signals (S), at least one variable magnetic gradient field acts on the examination zone, so that the k space is scanned at scanning points ($k_x(t_i)$, $k_y(t_i)$). The position (x, y) of the microcoil (11, 12) is determined from at least three scanning values ($S(t_i)$) of a microcoil MR signal and the associated scanning points ($k_x(T_i)$, $k_y(t_i)$) for example by solving a system of equations formed from these values. The MR method can be used for various scanning modes of the k space, and the acquisition of the microcoil MR signals (S) does not require any MR sequences other than the MR sequences required for determining the nuclear magnetization distribution in the examination zone.

13 Claims, 3 Drawing Sheets

MR METHOD AND MR DEVICE FOR DETERMINING THE POSITION OF MICROCOIL

BACKGROUND OF THE INVENTION

1. Field of the Invention

The invention relates to an MR method for determining the position of at least one microcoil which is provided in or on an object to be examined which is situated in an examination zone, at least one variable magnetic gradient field acting on the examination zone during the acquisition of microcoil MR signals so that the k space is scanned at scanning points.

In this context a microcoil is to be understood to mean a coil which can pick up MR signals only from a volume which is small in comparison with the overall examination zone. In order to distinguish the MR signals picked up by the microcoil from other MR signals, for example MR signals detected by means of a receiving coil system in order to determine the nuclear magnetization distribution in the examination zone, they are referred to as microcoil MR signals. MR stands for magnetic resonance. The k space is to be understood as the spatial frequency domain which is scanned at scanning points by variation of the magnetic gradient fields.

2. Description of Related Art

An MR method of the kind set forth is known from EP-A 731 362, which corresponds to U.S. Pat. No. 5,644,234. Therein, the k space is scanned at scanning points which are situated on radial paths extending through the zero point of the k space. The position of the microcoil is determined by frequency analysis of a microcoil MR signal in that the maximum of the spectrum of a microcoil MR signal (i.e. the Fourier transform of the microcoil MR signal) is determined. However, this MR method is limited to applications involving radial scanning of the k space and, moreover, necessitates calculation of the Fourier transforms of microcoil MR signals.

SUMMARY OF THE INVENTION

It is an object of the present invention to provide an MR method for determining the position of a microcoil which can be applied irrespective of the type of scanning of the k space.

This object is achieved according to the invention in that the position of the microcoil is determined from at least three scanning values of a microcoil MR signal and the associated scanning points.

The invention is based on the idea to determine the position of the microcoil directly from the measured microcoil MR signals, without it first being necessary to perform a Fourier transformation or another transformation on the measured MR microcoil MR signal. For each (measured) scanning value of a microcoil MR signal a relationship between the associated (known) scanning points (k values) in the K space and the unknown position values of the microcoil searched can be established in the form of an equation. In this context the term "associated" is to be understood to mean that an equation can be formed for the scanning points and the scanning value associated with the same scanning instant. A system of equations can be formed from a plurality of such equations. Such a system of equations is solved by means of different mathematical methods, i.e. the position values of the actual position of the microcoil are determined.

In a further version of the MR method according to the invention first the phase values of scanning values of a microcoil MR signal are determined and subsequently the position of the microcoil is determined from at least three phase values and the associated scanning points. For each scanning value a phase value can be calculated which forms the value of the so-called accumulated phase. The accumulated phase describes the angle of the precessional motion of the spins in the vicinity of the microcoil under the influence of the magnetic gradient field. The above equations can also be written in a different form so as to establish a relationship between a phase value, the associated scanning point in the k space and the position values searched for the microcoil. A system of equations can again be formed from a plurality of equations describing these relationships, said system being solvable (approximately) by means of different mathematical methods in order to determine the position values of the microcoil.

In a version of the MR method according to the invention the position of the microcoil is determined by minimizing an error function, the error function being formed from equations describing the respective relationship between a scanning value of a microcoil MR signal, the associated scanning points and the position values searched for the microcoil. Because noise is superposed on the measured microcoil MR signals, it is usually not possible to find an exact solution for the position values of the microcoil by solving a system of equations consisting of two or three equations. Therefore, preferably a large number of equations is taken into account, resulting in a redundant system of equations whose solution is determined by minimizing an error function.

In a further version of the MR method according to the invention, which is based thereon, the error function is formed from difference values between a respective scanning value of a microcoil MR signal and a signal characteristic value formed from the associated scanning points and the position values of the microcoil, values of the error function being determined for different position values in order to minimize the error function. The error function may then consist of, for example the sum of a plurality of difference values raised to the square. A minimum of the error function can be found by using known search algorithms which determine inter alia values of the error function for different position values. The position values for which a minimum is obtained then constitute the position values searched for the microcoil.

In an alternative version of the MR method according to the invention, first the phase values of scanning values of a microcoil MR signal are determined, the error function being formed from difference values between a respective phase value and a phase characteristic value formed from the associated scanning points and the position values of the microcoil, values of the error function being determined for different position values in order to minimize the error function. The difference with respect to the previous version resides essentially in the fact that in this case first the phase values of scanning values are determined and that therefrom difference values are formed on the basis of the above relationship between a phase value, the associated scanning points and the position values taken up in the error function. For the remainder, the same as stated above holds again.

In a further version of the MR method according to the invention position values of the previous position of the microcoil and/or the direction of movement of the microcoil are taken into account in order to determine the position of the microcoil. Thus, the calculations required to determine the instantaneous position can be substantially reduced. For example, if the direction of movement of the microcoil is only approximately known, it already suffices to calculate values of an error function only for the position values situated in this direction. Knowledge of the previous position of the microcoil also reduces the required calculations, because the speed of movement of the microcoil is usually known and hence the calculation of values of the error function can be limited to a given vicinity of the previous position of the microcoil.

In a further version of the MR method according to the invention, the position of the microcoil is determined from a limited number of preferably two or three, mutually independent equations which describe the respective relationship between a scanning value of a microcoil MR signal, the associated scanning points and the position values searched for the microcoil. Ideally, two or three equations suffice to enable exact determination of two position values (in the two-dimensional case) or three position values of the microcoil (in the three-dimensional case). Depending on the scanning method used to scan the k space, appropriate scanning points are selected so as to form said equations and to determine the position of the microcoil.

In a preferred further version of the invention, a receiving coil system detects MR signals in order to determine the nuclear magnetization distribution in the examination zone and at the same time the microcoil MR signals are detected by means of a microcoil. This offers the advantage that the acquisition of the microcoil MR signals does not require the use of separate MR sequences which would represent an additional investment and require additional measuring time.

The invention also relates to an MR device for carrying out the MR method according to the invention, which device includes a receiving coil system for receiving MR signals, at least one microcoil for receiving microcoil MR signals, and means for generating at least one variable magnetic gradient field which acts on the examination zone in order to scan the k space at scanning points, said device being characterized in that there are provided means for determining the position of the microcoil from at least three scanning values of a microcoil MR signal and the associated scanning points.

BRIEF DESCRIPTION OF THE DRAWINGS

The invention will be described in detail hereinafter with reference to the drawing. Therein.

DETAILED DESCRIPTION OF THE PREFERRED EMBODIMENTS

Figure 1:
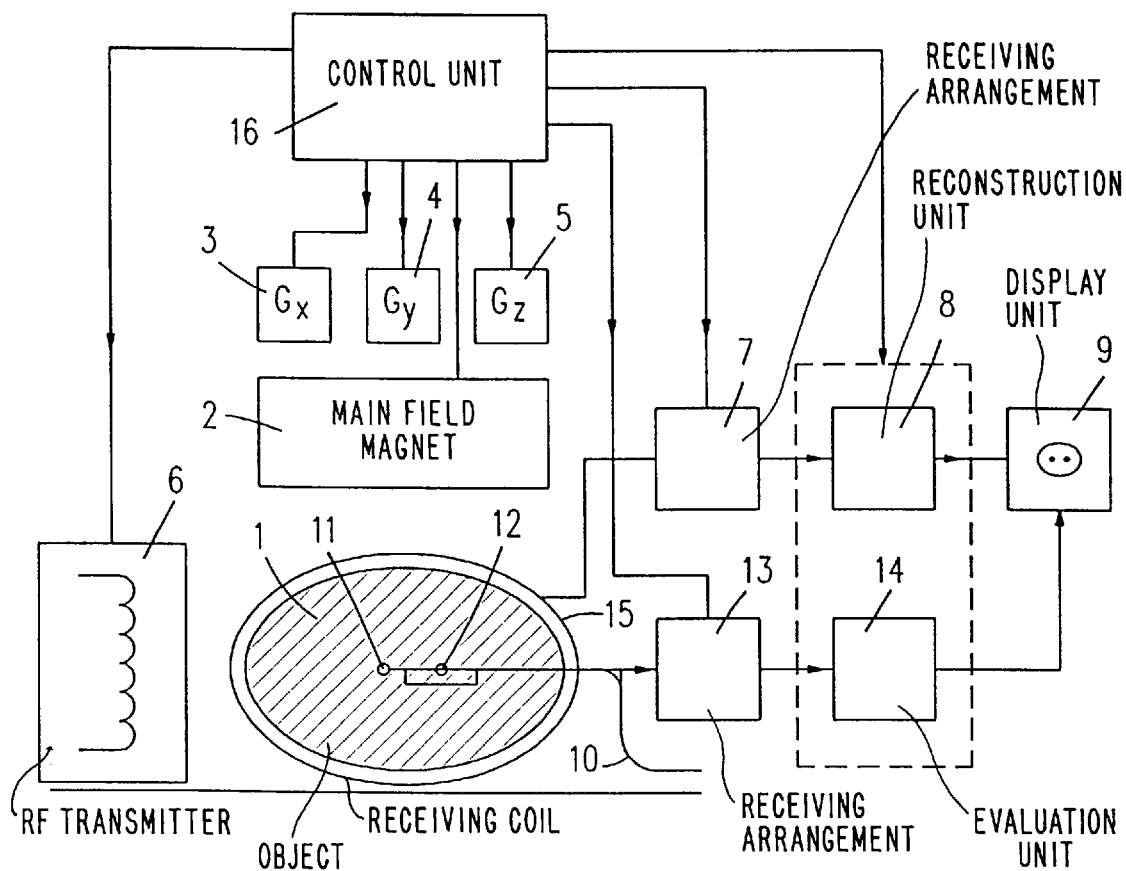
FIG. 1 shows an MR device which is suitable for carrying out the invention.

The reference numeral 1 in FIG. 1 denotes an object to be examined which is arranged in an examination zone which is exposed to a uniform, static magnetic field which is generated by a main field magnet 2. The static, uniform magnetic field can be modified by means of three gradient systems 3, 4 and 5 which generate a respective magnetic gradient field which also extends in the direction of the uniform, static magnetic field but has a gradient in the x, the y or the z direction. There is also provided an RF transmitter 6 which is capable of pulse-wise generating an RF magnetic field in the examination zone.

The MR signals generated in the object 1 to be examined are detected by a receiving coil system 15 (which may consist of one or more receiving coils) in conjunction with a receiving arrangement 7 (which may include one or more receiving channels). The nuclear magnetization distribution in the examination zone is reconstructed from the digitized MR signals, after a Fourier transformation, in a reconstruction unit 8 so as to be displayed as an MR image on a display unit 9.

A surgical instrument, for example a catheter 10, is introduced into the object 1 to be examined; a microcoil 11 is provided on the tip of said catheter, and possibly also elsewhere thereon, (12). The signals supplied by the microcoils 11, 12 are applied to a monochannel or multichannel receiving arrangement 13. The digitized microcoil MR signals are subsequently applied to an evaluation unit 14 which determines the position of the microcoil (coils) 11, 12 and reproduces it in the MR image displayed on the display unit 9. As is denoted by dashed lines, the components 8 and 14 can be implemented by means of a suitably programmed computer. The components 2 to 15 are controlled by a programmable control unit 16.

The MR method according to the invention will be described in detail hereinafter with reference to the flow chart of FIG. 2. The dimensions of a microcoil are typically of the order of magnitude of the pixels of an MR image or smaller. Therefore, the microcoil MR signals received thereby originate from a small area in the vicinity of the microcoil which may be considered to be punctiform. Subject to the conditions that the microcoil is situated in the imaging plane and that the z axis of a cartesian co-ordinate system as assumed hereinafter extends perpendicularly to the image plane, a scanning value of a microcoil MR signal from a punctiform area can be mathematically described as:

$$S(t_i) = A \exp[-j(k_x(t_i)x + k_y(t_i)y + \phi_0)] \quad (1)$$

where

S is a measured microcoil MR signal $t_i$ is the in scanning instant,

A is a constant which is dependent on the system (and the location), $k_x(t_i)$, $k_y(t_i)$ are the k values in the x direction and the y direction (scanning points in the k space), respectively, x, y are the x and y positions of the microcoil to be determined, and $\phi_0$ is the initial phase of the microcoil MR signal.

The scanning points $k_x(t_i)$ and $k_y(t_i)$ are defined when the MR sequence is generated and, therefore, can be considered to be known. The position of the scanning points $k_x(t_i)$, $k_y(t_i)$ in the spatial frequency domain is determined by the temporal variation of the associated gradient magnetic field in such a manner that a scanning point corresponds to the time integral over the associated gradients. During the acquisition of MR signals, the magnetic gradient fields are varied in respect of field strength and duration, so that the k space is scanned at different scanning points $k_x(t_i)$, $k_y(t_i)$. In the presence of one or more gradients (for example, a read gradient), there are successively acquired the scanning values $S(t_i)$ which, on the basis of the above equation (1), can also be simplified as $$S(t_i)=A \exp[-j\phi(t_i)], \qquad (2)$$

where $$\phi(t_i)=k_x(t_i)x+k_y(t_i)y+\phi_0 \qquad (3)$$

is the so-called accumulated phase.

In block 20 first the accumulated phase $\phi(t_i)$ is determined from the scanning values $S(t_i)$. The division of the imaginary component by the real component of the scanning value in conformity with the equation (2) first yields the tangent of the accumulated phase:

$$\tan \phi(t_i)=-\text{Im}\{S(t_i)\}/\text{Re}\{S(t_i)\}. \qquad (4)$$

The accumulated phase $\phi(t_i)$ itself can be determined only modulo-$2\pi n$ by using the arc tan function with an unknown integer n, i.e. initially only a number of feasible values $\phi'(t_i)$ is obtained:

$$\phi'(t_i)=\phi(t_i)+2\pi n \qquad (5)$$

For the first value, so $\phi'(t_1)$, n=0 is defined arbitrarily. Starting from $\phi'(t_1)$, further values are stepwise determined. From the feasible values for $\phi'(t_2)$, that value is selected which is nearest to $\phi'(t_1)$. The correctness of this choice follows from the scanning theorem according to which the phase angle between two instants of scanning may amount to no more than $\pi$. This method is continued until all values $\phi(t_1)$ have been unambiguously determined for all scanning values $S(t_i)$. Instead of selecting the value nearest to $\phi(t_1)$ for $\phi'(t_2)$, $\phi'(t_2)$ could also be determined by a local correlation, a local adaptation or a local statistic.

On the basis of the equation (3), the equations for all scanning instants $t_i=t_1 \ldots t_m$ constitute a system of m equations with the unknowns x and y:

$$\phi(t_1)=k_x(t_1)x+k_y(t_1)y+\phi_0 \qquad (6)$$

$$\phi(t_m)=k_x(t_m)x+k_y(t_m)y+\phi_0$$

Solution of this generally redundant system of equations yields the values x and y searched. The initial phase $\phi_0$ is obtained, for example for $k_x=k_y=0$. On the basis of the system of equations (6), an error function F' is composed in block 21, for example as $$F' = \sum_i ([k_x(t_i)x + k_y(t_i)y + \phi_0] - \phi(t_i))^2 \qquad (7)$$

$$= \sum_i (R'(t_i) - \phi(t_i))^2 = \sum_i (D'(t_i))^2.$$

This error function (the sum of the error squares) contains difference values $D'(t_i)$ which result from a respective one of the equations of the system of equations (6) as a difference between a measured phase value $\phi(t_i)$ and a phase characteristic value $R'k_x(t_i)=k_x(t_i)x+k_y(t_i)y+\phi_0$.

In block 22 the error function F' is minimized by means of customary mathematical methods, for example in that values of the error function F' are calculated for different values of x, y. The values x, y for which a minimum of the error function F' occurs are the position values x, y searched for the microcoil.

According to the method of the invention, determination of the position of the microcoil does not require Fourier transformation of the microcoil MR signal. It is a further advantage that no separate MR sequences are required to acquire the microcoil MR signals since the microcoil MR signals can be received parallel to the MR signals received by the receiving coil arrangement.

Figure 2:
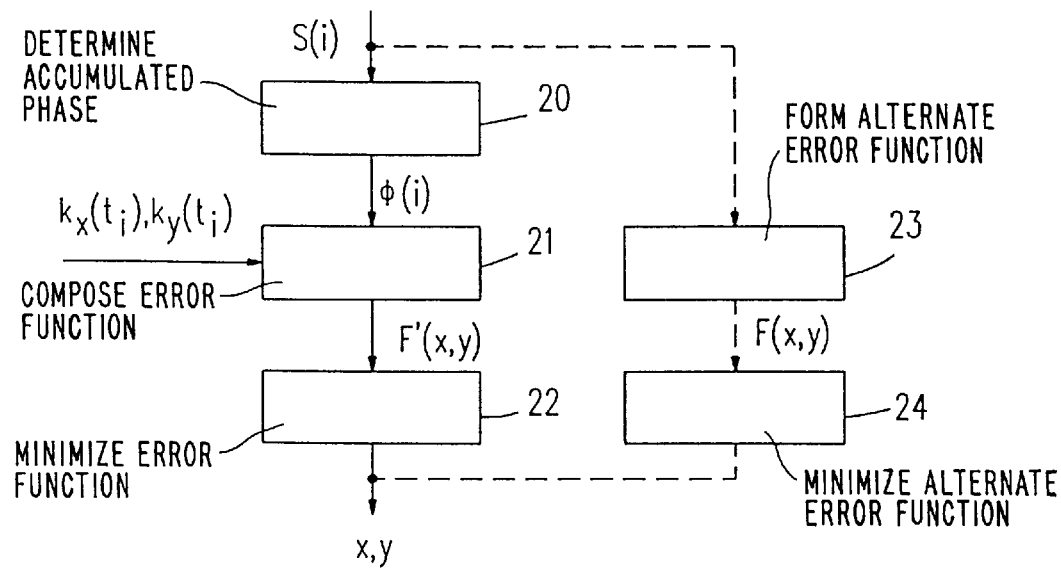
FIG. 2 shows a flow chart illustrating the MR method according to the invention.

Dashed lines in FIG. 2 indicate an alternative solution. On the basis of the scanning values $S(t_i)$, a system of equations (8) is formed as follows:

$$S(t_1)=A \exp[-j(k_x(t_1)x+k_y(t_1)y+\phi_0)] \qquad (8)$$

$$S(t_m)=A \exp[-j(k_x(t_m)x+k_y(t_m)y+\phi_0)]$$

An error function F is formed therefrom in block 23:

$$F = \sum_i (A \exp[-j(k_x(t_i)x + k_y(t_i)y + \phi_0)] - S(t_i))^2 \qquad (9)$$

$$= \sum_i (R(t_i) - S(t_i))^2 = \sum_i (D(t_i))^2$$

which function is formed as a sum of squared difference values, a difference value containing the difference between a signal characteristic value $R(t_i)=A \exp[-j(k_x(t_i)x+k_y(t_i)y+\phi_0)]$ and a scanning value $S(t_i)$. Solution of this error function F is performed by minimizing in block 24 in the same way as described above, yielding the position values x, y searched.

The solution of the error function F or F' can also be found by means of other known mathematical means, for example by using a simplex algorithm. Moreover, an error function need not necessarily be formed from the system of equations (6) or (8). The solution of the system of equations could also be found, for example by a singular value decomposition or by other mathematical methods. Because the measured scanning values $S(t_i)$ contain a comparatively large noise contribution, the error function F or F' is formed as the sum of a plurality of squared difference values $D(t_i)$ or $D'(t_i)$ in order to suppress the effect of noise as much as possible and to obtain an as accurate as possible solution for x and y. In the method according to the invention, however, a solution for the position values x and y can also be determined while using a small number of equations (1) or (3). This will be explained hereinafter with reference to the FIGS. 3 to 5 which illustrate different scans of the k space. According to the scanning methods shown therein, scanning is continuous, i.e. there are not phase jumps, so that the phase of each scanning value can be unambiguously determined.

Figure 3:
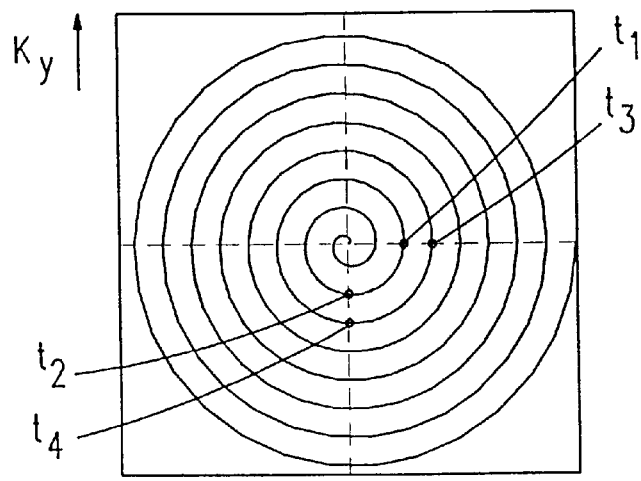
FIG. 3 shows the position of scanning points in the case of spiral scanning of the k space.

According to the spiral method, the k space is scanned along spiral paths (see FIG. 3), i.e. the scanning points $k_x(t_i)$, $k_y(t_3)$ are situated on spiral paths. In order to cover the entire k space, generally a plurality of interleaved sub-spirals. FIG. 3 shows such a sub-spiral. From the spiral shape of the scanning path it follows that $k_x$ and $k_y$ have zero positions at different instants. It holds for the measuring points $t_1$ and $t_3$ that:

$$k_y(t_1)=k_y(t_3)=0 \text{ and } \phi(t_3)-\phi(t_1)=[k_x(t_3)-k_x(t_1)]x. \qquad (10)$$

Analogously, it holds at the measuring points $t_2$ and $t_4$ that:

$$k_y(t_2)=k_x(t_4)=0 \text{ and } \phi(t_4)-\phi(t_2)=[k_y(t_4)-k_y(t_2)]y. \qquad (11)$$

From the equation (10) it follows for the x position of the microcoil that:

$$x=[\phi(t_3)-\phi(t_1)]/[k_x(t_3)-k_x(t_1)], \qquad (12)$$

and from the equation (11) it follows for the y position of the microcoil that:

$$y=[\phi(t_4)-\phi(t_2)]/[k_y(t_4)-k_y(t_2)]. \quad (13)$$

If the measuring points $t_1$ to $t_4$ do not correspond exactly to scanning points $k_x(t_i)$, $k_y(t_i)$, the phase values $\phi(t_i)$ to $\phi(t_4)$ can be readily determined by interpolation from the phase values $\phi(t_i)$ of neighboring scanning values $S(t_i)$.

Figure 4:
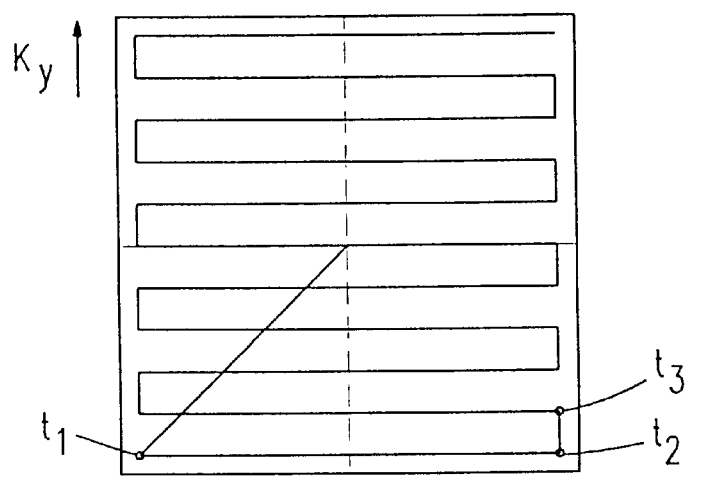
FIG. 4 shows the position of scanning points in the case of EPI scanning of the k space.

According to the EPI method (EPI=echo planar imaging), the k space is scanned along parallel lines (see FIG. 4). For the position determination the phase values at three corner points of the k space path are taken into account (scanning instants $t_1$, $t_2$, $t_3$). The $k_y$ value is identical at the points $t_1$ and $t_2$ ($k_y(t_1)=k_{y(t_2)}$). Using the equation (3), for the x position of the microcoil it follows therefrom that:

$$x=[\phi(t_2)-\phi(t_1)]/[k_x(t_2)-k_x(t_1)]. \quad (14)$$

Analogously, for the measuring points $t_2$ and $t_3$ it holds that $k_x(t_2)=k_x(t_3)$ and for the y position of the microcoil that:

$$y=[\phi(t_3)-\phi(t_2)]/[k_y(t_3)-k_y(t_2)]. \quad (15)$$

Figure 5:
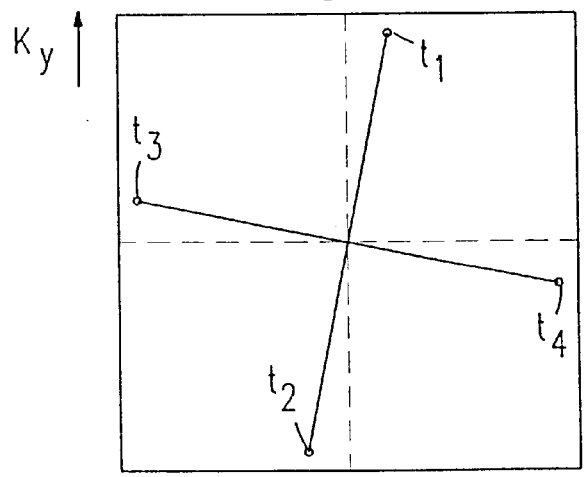
FIG. 5 shows the position of scanning points in the case of radial scanning of the k space.

According to the radial method, the k space is traversed along radial lines (see FIG. 5 in which only two radial lines are shown). The phase values at four scanning points are used for position detection. On the basis of the equation (3), the difference between the phase values at the measuring points $t_1$ and $t_2$ is calculated:

$$\phi(t_2)-\phi(t_1)=[k_x(t_2)-k_x(t_1)]x+[k_y(t_2)-k_y(t_1)]y. \quad (16)$$

Analogously, the difference is obtained for the phase values at the measuring points $t_3$ and $t_4$:

$$\phi(t_4)-\phi(t_3)=[k_x(t_4)-k_x(t_3)]x+[k_y(t_4)-k_y(t_3)]y. \quad (17)$$

The equations (16) and (17) together form a system of two equations with two unknowns. This can be unambiguously solved if the two k space lines are not parallel. The solution represents positions x, y searched for the microcoil.

The methods described with reference to the FIGS. 3 to 5 could also be varied in a sense that solutions for the values x, y are repeatedly calculated at different scanning points and that the ultimate solution for x, y is formed by averaging. Further it is not necessary to take into account the corner points (in the case of the EPI method) or the end points of k space paths (in the case of the radial method); the phase values in other scanning points can also be evaluated. The solutions shown, however, constitute a particularly fast and simple solution. Instead of the phase values $\phi(t_i)$ it is also possible to evaluate the scanning values $S(t_i)$ at the indicated scanning points so as to determine the microcoil positions therefrom.

Figure 6:
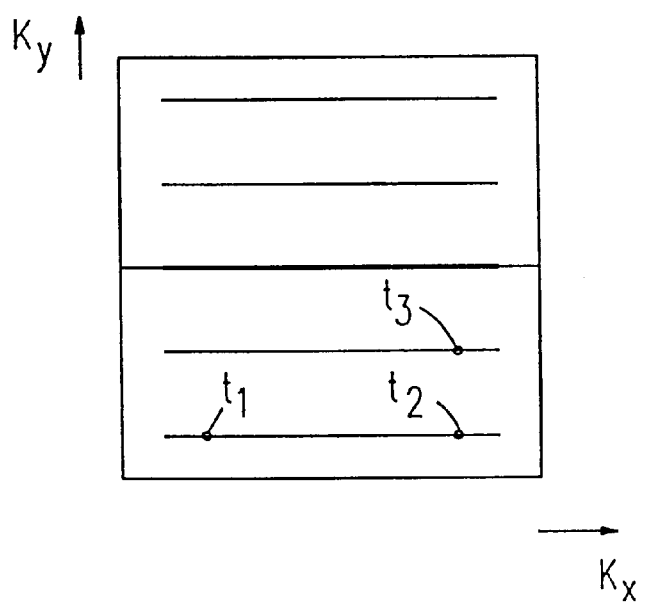
FIG. 6 shows the position of scanning points in the case of linear scanning of the k space.
Figure 7:
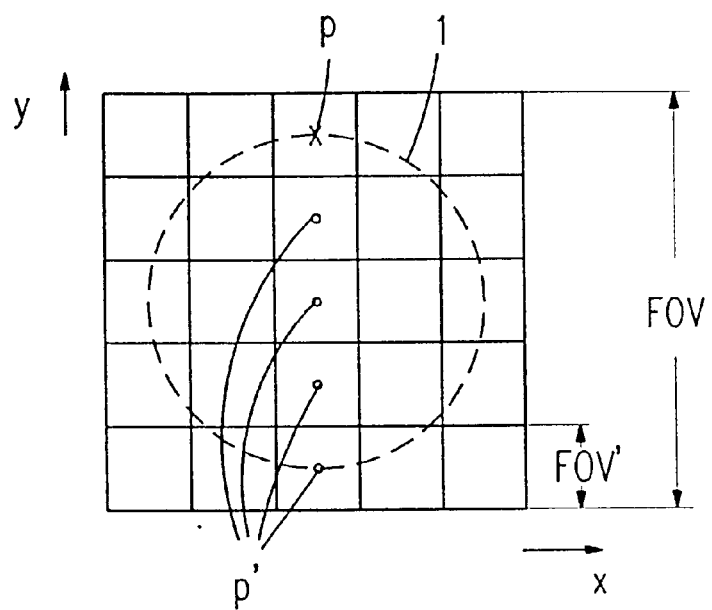
FIG. 7 shows the configuration in physical space in order to illustrate the MR method according to the invention.

FIG. 6 shows a further version of the MR method according to the invention in which the k space is not continuously scanned. The scanning of the k space according to the spin warp method shown takes place along lines extending parallel to the $k_x$ axis. After an RF excitation, one or more lines in the k space are read (solid lines in FIG. 6). If several lines in the k space are measured, thus uniformly covering the k space, sub-scanning of the k space will occur perpendicularly to the read-out direction. This corresponds to the scanning of the physical space in the y direction with a reduced field of view (FOV). Analogously to the equation (14), the x position can be determined exactly from phase values $\phi(t_i)$ or signal values $S(t_i)$ measured at measuring points $t_i$, for example $t_1$ and $t_2$, on a k space line. The y position of the microcoil, however, can be determined only by taking into account the information of the measuring point $t_3$ which is situated on a different, preferably neighboring line:

$$y=y_0+n*FOV/L, \quad (18)$$

where n is an integer, FOV is the magnitude of the field of view, and the integer L is the distance, given in units of the phase encoding increment, between neighboring parallel k space lines. The value FOV'=FOV/L is referred to as a reduced field of view. This is illustrated again in FIG. 7. Therein, the position in space of the microcoil which is obtained from the equation (18) for n=0 (denoted by p) is reproduced. For other values of n other positions (other y values) of the microcoil are obtained, which positions are denoted by the reference p'. The true position of the microcoil is indefinite up to n$\epsilon$(0, ... L-1). However, the value for n can often be determined, and hence also the actual position of the microcoil, from secondary conditions. This is the case, for example, when it is known from the propagation speed of the microcoil that it cannot travel further than FOV' between two successive position determinations. Knowledge concerning the direction of travel of the microcoil or its initial position can also be used for this purpose. Exact determination of the position of the microcoil is also possible when the k space has been completely scanned according to this scanning method and meanwhile no movement of the microcoil has occurred.

The described method can also be extended to three-dimensional position detection. To this end, the microcoil MR signal must be additionally measured in the presence of a z magnetic field gradient and the z co-ordinate of the microcoil must be determined analogously to the method described above. At least four scanning points are then required for the determination of the position of the microcoil.

The MR method and the MR device according to the invention can also be used for determining the position of a microcoil without MR signals for forming MR images being acquired at the same time. For example, the microcoil position determined by means of the method according to the invention can be reproduced in a previously formed (possibly three-dimensional) MR image or in an image formed by means of a different measuring device (for example, an ultrasonic image or a computer tomography image).

The position detection can also be performed in a co-ordinate system other than the described system, for example in a co-ordinate system defined by the user in dependence on the position of the scanning layers.

All references cited herein, as well as the priority document German Patent Application 19706703.4 filed Feb. 20, 1997, are incorporated herein by reference in their entirety and for all purposes to the same extent as if each individual publication or patent or patent application was specifically and individually indicated to be incorporated by reference in its entirety for all purposes.

What is claimed is:

1. A magnetic resonance (MR) method for determining the position of at least one microcoil which is provided in or on an object to be examined which is situated in an examination zone, the method comprising:

scanning k-space at known scanning points in k-space by generating at least one variable magnetic gradient field acting on the examination zone, measuring values of microcoil MR signals at at least three of the known scanning points in k-space, and determining position values of the microcoil directly and without Fourier transformation from at least three measured values of the microcoil MR signal and from the k-values of the associated known scanning points in k-space.

2. An MR method as claimed in claim 1, wherein the step of determining position values further comprises determining the phase values of at least three measured values of the microcoil MR signal, and finally determining further the position values of the microcoil from the at least three determined phase values and the k-values of the associated known scanning points in k-space.

3. An MR method as claimed in claim 2, wherein the step of finally determining further the position values from phase values further comprises forming an error function from difference values between a respective determined phase value and a phase characteristic value formed from the k-values of the associated known scanning points in k-space and the position values of the microcoil, and determining values of the error function for different position values in order to minimize the error function.

4. The method of claim 3 wherein the error function depends on a sum of squares of the difference values.

5. An MR method as claimed in claim 1, wherein the step of finally determining the position values of the microcoil further comprises minimizing an error function formed from equations describing the respective relationship between a measured value of the microcoil MR signal, the k-values of the associated known scanning points in k-space and the position values searched for the microcoil.

6. An MR method as claimed in claim 5, wherein the error function is formed from difference values between a respective measured value of the microcoil MR signal and a signal characteristic value formed from the k-values of the associated known scanning points in k-space and the position values of the microcoil, and wherein the error function is minimized by calculating its value for different position values.

7. The method of claim 6 wherein the error function depends on a sum of squares of the difference values.

8. An MR method as claimed in claim 1, wherein position values a previous position of the microcoil or a direction of movement of the microcoil are taken into account in order to determine the position of the microcoil.

9. An MR method as claimed in claim 1, wherein the position of the microcoil is determined from two or three mutually independent equations which describe the respective relationship between a measured value of the microcoil MR signal, the k-values of the associated known scanning points in k-space and the position values searched for the microcoil.

10. An MR method as claimed in claim 1, wherein a receiving coil system detects MR signals in order to determine the nuclear magnetization distribution in the examination zone, and wherein at the same time the microcoil detects MR signals.

11. The method of claim 1 wherein the step of scanning k-space further comprises scanning according to a spiral method, or an echo planar imaging method, or a radial method, or a spin-warp method.

12. The method of claim 1 wherein the position values of the microcoil are determined from three measured values of the MR microcoil signal.

13. A magnetic resonance (MR) device comprising:

means for scanning k-space at known scanning points in k-space by generating at least one variable magnetic gradient field acting on the examination zone, a receiving coil system for receiving MR signals, at least one microcoil for measuring microcoil MR signals at least three of the known scanning points in k-space, and means for determining the position values of the microcoil directly and without Fourier transformation from at least three measured values of the microcoil MR signal and from the k-values of the associated known scanning points in k-space.

* * * * *